(12) United States Patent  (10) Patent No.: US 7,994,487 B2
Ray  (45) Date of Patent: Aug. 9, 2011

(54) CONTROL OF PARTICLES ON SEMICONDUCTOR WAFERS WHEN IMPLANTING BORON HYDRIDES

(75) Inventor: Andrew M. Ray, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 264 days.

(21) Appl. No.: 12/474,786

(22) Filed: May 29, 2009

(65) Prior Publication Data

US 2009/0294698 A1 Dec. 3, 2009

Related U.S. Application Data

(60) Provisional application No. 61/057,485, filed on May 30, 2008.

(51) Int. Cl.
*H01J 37/08* (2006.01)
(52) U.S. Cl. ............... 250/492.2; 250/423 R; 134/21
(58) Field of Classification Search .............. 250/492.21
See application file for complete search history.

(56) References Cited

U.S. PATENT DOCUMENTS

| | | | |
|---|---|---|---|
| 4,512,812 A * | 4/1985 | Liebert et al. | 134/21 |
| 5,554,854 A | 9/1996 | Blake | |
| 5,814,819 A | 9/1998 | Sinclair et al. | |
| 6,013,332 A | 1/2000 | Goto et al. | |
| 6,221,169 B1 | 4/2001 | Bernstein et al. | |
| 6,958,481 B2 | 10/2005 | Horsky et al. | |
| 6,992,311 B1 | 1/2006 | Ring et al. | |
| 7,060,995 B2 | 6/2006 | Bresolin et al. | |
| 2006/0086376 A1 * | 4/2006 | Dimeo et al. | 134/22.1 |

* cited by examiner

*Primary Examiner* — Phillip A Johnston
(74) *Attorney, Agent, or Firm* — Eschweiler & Associates, LLC

(57) ABSTRACT

A method for reducing particle contamination during implantation of ions comprises providing an implantation system for implanting ions into a workpiece via an ion beam, wherein one or more components are under selective vacuum and have one or more contaminants in a first state disposed thereon. A gas is introduced to the implantation system, wherein the gas generally reacts with at least a portion of the one or more contaminants, therein transforming the at least a portion of the one or more contaminants into a second state The at least a portion of the one or more contaminants in the second state remain disposed on the one or more components, and wherein the at least a portion of the second state of the one or more contaminants generally does not produce particle contamination on the one or more workpieces.

8 Claims, 4 Drawing Sheets

CONTROL OF PARTICLES ON SEMICONDUCTOR WAFERS WHEN IMPLANTING BORON HYDRIDES

REFERENCE TO RELATED APPLICATION

This application claims priority to and the benefit of U.S. Provisional Application Ser. No. 61/057,485 which was filed May 30, 2008, entitled, CONTROL OF PARTICLES ON SEMICONDUCTOR WAFERS WHEN IMPLANTING BORON HYDRIDES, the entirety of which is hereby incorporated by reference as if fully set forth herein.

FIELD OF THE INVENTION

The present invention relates generally to ion implantation systems, and more specifically to systems and methods controlling particulate contamination in an ion implantation system.

BACKGROUND OF THE INVENTION

In the manufacture of semiconductor devices and other products, ion implantation systems are used to impart impurities, known as dopant elements, into semiconductor wafers, display panels, or other workpieces. Conventional ion implantation systems or ion implanters treat a workpiece with an ion beam in order to produce n- or p-type doped regions, or to form passivation layers in the workpiece. When used for doping semiconductors, the ion implantation system injects a selected ion species to produce the desired extrinsic material. For example, implanting ions generated from source materials such as antimony, arsenic, or phosphorus results in n-type extrinsic material wafers. Alternatively, implanting ions generated from materials such as boron, gallium, or indium creates p-type extrinsic material portions in a semiconductor wafer.

Conventional ion implantation systems include an ion source that ionizes a desired dopant element which is then accelerated to form an ion beam of prescribed energy. The ion beam is directed at a surface of the workpiece to implant the workpiece with the dopant element. The energetic ions of the ion beam penetrate the surface of the workpiece so that they are embedded into the crystalline lattice of the workpiece material to form a region of desired conductivity. The implantation process is typically performed in a high vacuum process chamber which prevents dispersion of the ion beam by collisions with residual gas molecules and which minimizes the risk of contamination of the workpiece by airborne particulates.

Ion dose and energy are two variables commonly used to define an ion implantation. The ion dose is associated with the concentration of implanted ions for a given semiconductor material. Typically, high current implanters (generally greater than 10 milliamps (mA) ion beam current) are used for high dose implants, while medium current implanters (generally capable up to about 1 mA beam current) are used for lower dose applications. Ion energy is used to control junction depth in semiconductor devices. The energy of the ions which make up the ion beam determine the degree of depth of the implanted ions. High energy processes, such as those used to form retrograde wells in semiconductor devices, typically require implants of up to a few million electron volts (MeV), while shallow junctions may only demand energies below 1 thousand electron volts (keV).

The continuing trend to smaller and smaller semiconductor devices requires implanters with ion sources that serve to deliver high beam currents at low energies. The high beam current provides the necessary dosage levels, while the low energy levels permit shallow implants. Source/drain junctions in complementary metal-oxide-semiconductor (CMOS) devices, for example, require such a high current, low energy application.

A typical ion source for obtaining atoms for ionization from a solid form is comprises a pair of vaporizers and an ionization chamber. Each of the vaporizers is provided with a crucible in which a solid element or compound is placed and which is heated by a heater coil to vaporize the solid source material. Vaporized source material passes through a nozzle, or compressed gas may be fed directly into the ionization chamber, wherein the gaseous/vaporized source material is ionized by an arc chamber filament that is heated to thermionically emit electrons.

Conventional ion sources utilize an ionizable dopant gas which is obtained either directly from a source of a compressed gas or indirectly from a solid which has been vaporized. Typical source elements are boron (B), phosphorous (P), gallium (Ga), indium (In), antimony (Sb), and arsenic (As). Most of these source elements are commonly used in both solid and gaseous form, except boron, which is almost exclusively provided in gaseous form, e.g., as boron trifluoride ($BF_3$).

In the case of implanting boron trifluoride, a plasma is created which includes singly charged boron (B+) ions. Creating and implanting a sufficiently high dose of boron into a substrate is usually not problematic if the energy level of the beam is not a factor. In low energy applications, however, the beam of boron ions will suffer from a condition known as "beam blow-up", which refers to the tendency for like-charged ions within the ion beam to mutually repel each other. Such mutual repulsion causes the ion beam to expand in diameter during transport, resulting in vignetting of the beam by multiple apertures in the beamline. This severely reduces beam transmission as beam energy is reduced.

Decaborane ($B_{10}H_{14}$) is a compound which is an excellent source of feed material for boron implants because each decaborane molecule ($B_{10}H_{14}$), when vaporized and ionized, can provide a molecular ion comprised of ten boron atoms. Such a source is especially suitable for high dose/low energy implant processes used to create shallow junctions, because a molecular decaborane ion beam can implant ten times the boron dose per unit of current as can a monatomic boron ion beam. In addition, because the decaborane molecule breaks up into individual boron atoms of roughly one-tenth the original beam energy at the workpiece surface, the beam can be transported at ten times the energy of a dose-equivalent monatomic boron ion beam. This feature enables the molecular ion beam to avoid the transmission losses that are typically brought about by low energy ion beam transport.

An exemplary ion implantation system 10 is illustrated in FIG. 1, wherein the ion implantation system comprises a terminal 12, a beamline assembly 14, and an end station 16. The terminal 12 includes a suitable ion source 20 powered by a power supply 22, wherein terminal is configured to produce and directs a molecular decaborane ion beam 24 through the beamline assembly 14, and ultimately, to the end station 16. The beamline assembly 14, for example, has a beamguide 26 and a mass analyzer 28 associated therewith, wherein a dipole magnetic field is established to pass only ions of appropriate charge-to-mass ratio through an aperture 30 at an exit end of the beamguide 26 to a workpiece 32 (e.g., a semiconductor wafer, display panel, etc.) disposed in the end station 16.

During the molecular decaborane ion implantation into the workpiece 32, however, various contaminants (not shown)

are typically generated from the molecular decaborane ion beam 24 over time, and strike and adhere or deposit on various components 34, such as the aperture 30 and Faradays 36 disposed along the beam path. Collisions of ions with the various components 34, for example, can further sputter contaminants (not shown) onto other surfaces 38 situated along the beam path. Implementations of decaborane ion sources, however, have led to unique particle contamination issues, as dissociation of the decaborane molecule and fragmentation of the $B_{10}H_X+$ desired parent ion can occur, and substantially large particles can quickly accumulate on various components 34 and surfaces 38 within the ion implantation system 10.

Conventionally, contaminants are removed from the ion implantation system by a manual cleaning of the components 34 and surfaces 38, wherein the various components are removed, cleaned, and then replaced. Such cleaning is typically performed by an operator during scheduled maintenance of the ion implantation system. Manual cleaning is typically costly, not only in terms of time and labor attributed to the operator, but also in terms of decreased efficiency and yield of the ion implantation system 10 due to increased down-time associated with the maintenance.

As an alternative, etchant gases, such as a highly reactive halide or fluorine gas, have been introduced into the ion implantation system 10 in an attempt to remove the contamination by chemical reaction between the contaminants and the etchant gases. This solution, however, typically requires a change of gases in the ion implanter 10, wherein the source material gas used for implanting ions into the workpiece 30 is purged from the ion implanter, the etchant gas is then used to remove the contamination, and then the etchant gas is further purged from the implanter prior to introducing source material gas again for processing of another workpiece. Such an etchant gas may remove some or all of the contaminants, however, the use of the etchant gas typically necessitates a considerable amount of time to not only introduce the gas, but to allow time for the etchant gas to react with and etch the contaminants, as well as time spent removing the etchant gas from the ion implantation system once etching is complete. The use of such etchant gases may thus decrease the efficiency of the ion implantation system 10, thereby decreasing a throughput of the implanter.

Accordingly, it is an object of the present invention to provide a method and apparatus to sufficiently reduce particle contamination in a molecular ion beamline assembly in a time-efficient manner, wherein efficient contaminant mitigation can be facilitated, and wherein high throughput and highly reliable molecular ion implantation into a workpiece can be achieved.

SUMMARY OF THE INVENTION

The present invention overcomes the limitations of the prior art by providing a method for reducing particle contamination in a molecular ion implantation system, wherein contamination is not necessarily removed from the ion implantation system, but rather, transformed. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an apparatus and method for reducing particle contamination in an ion implantation system using a gas for transforming contamination in the ion implantation system. The method comprises providing an ion implantation system for implanting ions into one or more workpieces via an ion beam, such as a molecular ion beam. The ion beam, for example, comprises a boron hydride such as decaborane or octadecaborane. The ion implantation system, for example, comprises one or more components under selective vacuum, wherein the one or more components have one or more contaminants associated with a formation of the ion beam disposed thereon, and wherein the one or more contaminants are generally in a first state.

In accordance with the invention, a gas containing water vapor is selectively introduced into the ion implantation system, wherein the gas generally reacts with at least a portion of the one or more contaminants. Accordingly, the at least a portion of the one or more contaminants is generally transformed into a second state. For example, decaborane contaminants are generally transformed into one or more of boric acid and diborane gas.

According to another aspect, the ion implantation system is then evacuated, wherein the at least a portion of the one or more contaminants in the second state remain disposed on the one or more components. For example, boric acid generally remains on the one or more components, while diborane gas can be generally evacuated from the ion implantation system. The boric acid, for example, generally does not produce particle contamination on the one or more workpieces.

The gas containing water vapor, for example, can be continuously flowed into the ion implantation system while ions are implanted into the one or more workpieces. Alternatively, the gas can be selectively flowed into the ion implantation system during non-production times, such as between processing lots or system maintenance.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
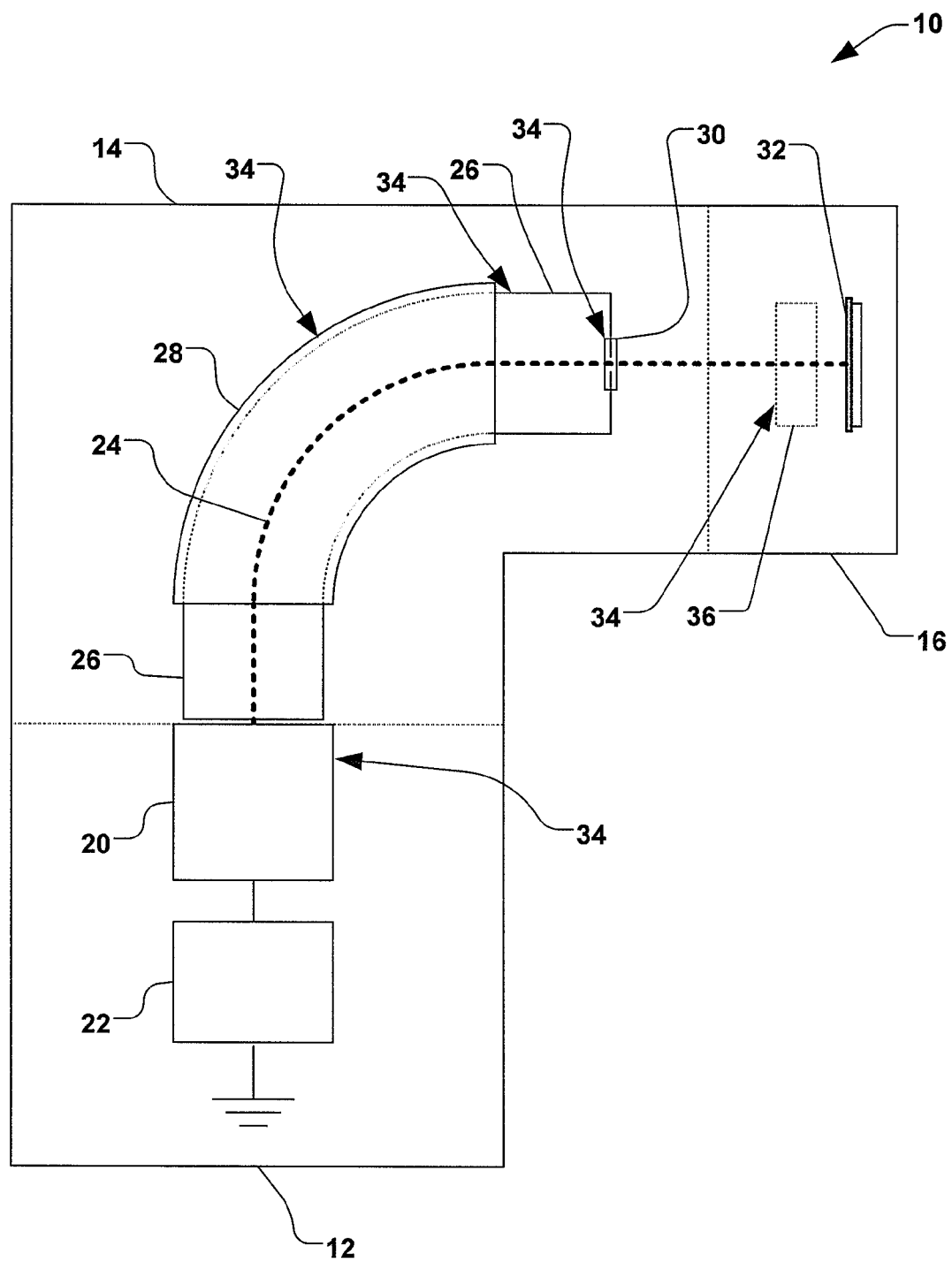
FIG. 1 is a plan view of a conventional ion implantation system.

The present invention is directed generally towards a method and apparatus for reducing particle contamination during an implantation of ions into one or more workpieces.

More particularly, the method provides an introduction of a non-etchant gas containing water vapor to an ion implantation system capable of generating ions form boron hydride chemistries, wherein contaminants are generally transformed, rather than removed, from the ion implantation system. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
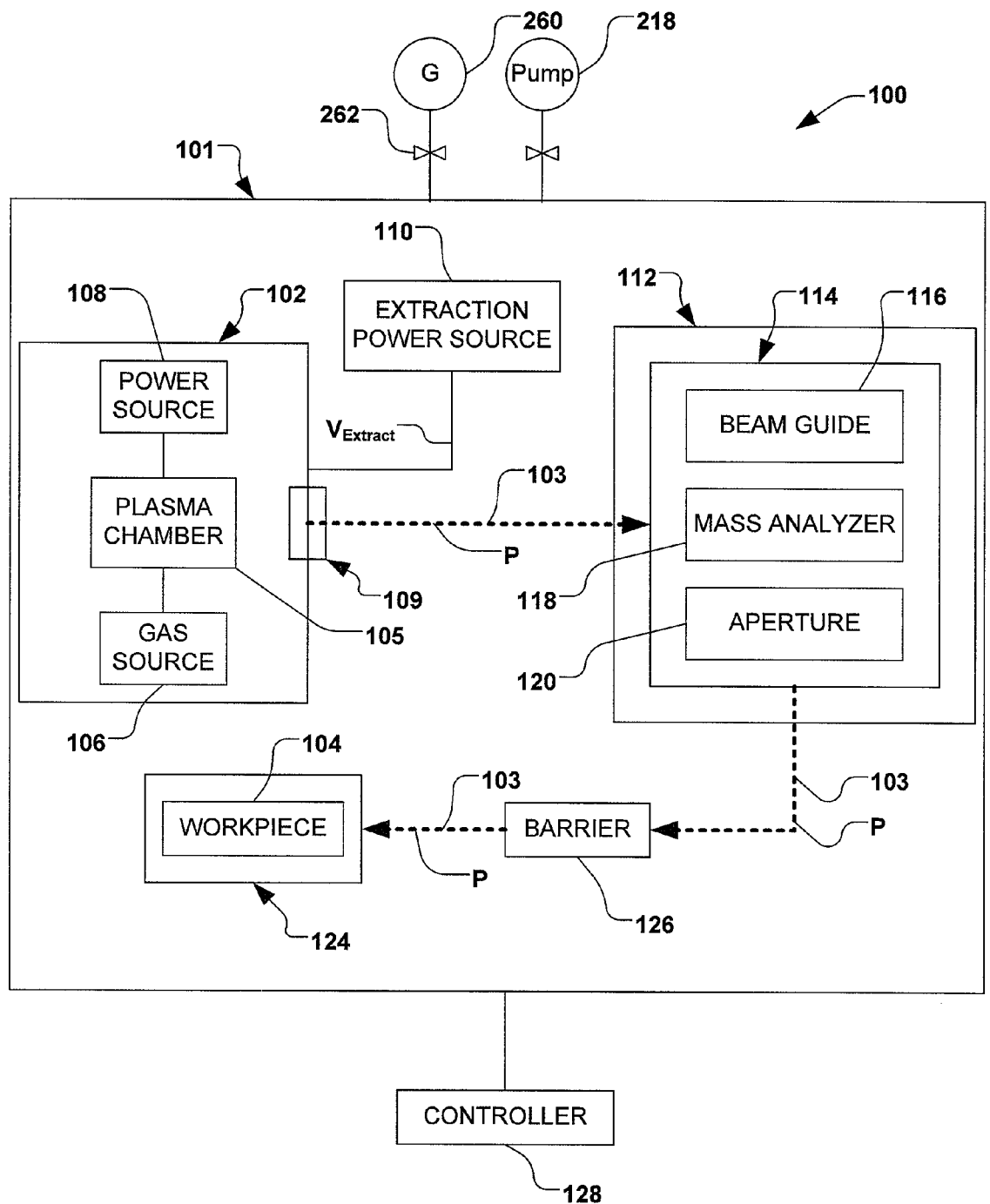
FIG. 2 is a system-level block diagram of an exemplary ion implantation system according to one aspect of the present invention.

In order to gain a better understanding of the invention, FIG. 2 illustrates an exemplary ion implantation system 100 depicted in block diagram form, wherein the exemplary ion implantation system is suitable for implementing one or more aspects of the present invention. The system 100 comprises an ion implantation apparatus 101 comprising an ion source 102 for producing a quantity of ions operable to travel along an ion beam path P, thus defining an ion beam 103 for implantation of the ions into a workpiece 104 (e.g., a semiconductor wafer, display panel, etc.). The ion source 102, for example, generally comprises a plasma chamber 105, a process gas source 106, and a power source 108, wherein positively charged ions are generated from the process gas within the plasma chamber by an application of power from the power source. The process gas source 106 may comprise a source material such as an ionizable gas or vaporized solid source material or species that has been previously vaporized. For an n-type implantation into the workpiece 104, for example, the source materials may comprise boron, gallium or indium. For a p-type implantation, for example, the source materials may comprise arsenic, phosphorus, or antimony.

The ion source 102 further comprises an extraction assembly 109 associated therewith, wherein charged ions are extracted from the ion source upon an application of an extraction voltage $V_{Extract}$ thereto. An extraction power source 110 is operable to provide the extraction voltage $V_{Extract}$, wherein the extraction voltage may be further modulated. A beamline assembly 112 is further provided downstream of the ion source 102, wherein the beamline assembly generally receives the charged ions. The beamline assembly 112, for example, comprises one or more components 114, such as a beamguide 116, a mass analyzer 118, and an aperture 120, wherein the one or more components are operable to form and shape the ion beam 103.

The mass analyzer 118, for example, further comprises a field generating component, such as a magnet (not shown), wherein the mass analyzer generally provides a magnetic field across the ion beam 103, thus deflecting ions from the ion beam at varying trajectories according to a charge-to-mass ratio of the ions. For example, ions traveling through the magnetic field experience a force that directs individual ions of a desired charge to mass ratio along the beam path P and deflects ions of undesired charge to mass ratios away from the beam path. Once through the mass analyzer 118, the ion beam 103 is directed though the aperture 120, wherein the ion beam is generally limited to produce a concise beam for implantation into the workpiece 104.

The ion implantation system 100 further comprises an end station 124, wherein the workpiece 104 generally resides. In the manufacture of integrated circuit devices, display panels, and other products, it is generally desirable to uniformly implant dopant species across the entire surface of the workpiece 104. The ion implantation apparatus 101 can therefore be configured to implant ions into a single workpiece 104 (e.g., a "serial" ion implanter), wherein the workpiece generally resides on a pedestal or chuck (not shown) situated within the end station 124. Alternatively, the ion implantation apparatus 101 can be configured to implant ions into multiple workpieces 104 (e.g., a "batch" ion implanter), wherein the end station 124 comprises a rotating platter (not shown), whereon several workpieces are translated with respect to the ion beam 103. It should be noted that any ion implantation apparatus operable to extract ions from an ion source and implant them into one or more workpieces is contemplated as falling within the scope of the present invention.

The ion implantation apparatus 101, in one example, further comprises a barrier 126 generally situated along the path P of the ion beam 103. In one example, the barrier generally resides between the beamline assembly 112 and the end station 124. The barrier 126, for example, is operable to selectively block the ion beam 103 from entering the end station 124. For example, the barrier 126 is operable to translate and/or rotate into and out of the ion beam path P, wherein the ion beam 103 is generally prevented from entering the end station 124 or impinging on the workpiece 104. Alternatively, the barrier 126 is situated within the end station 124, wherein the barrier generally resides along the ion beam path P at a position downstream of the workpiece 104. The barrier 126 may serve one or more purposes, such as to substantially block the ion beam 103 and/or to provide a measurement component for analyzing the ion beam (e.g., a Faraday).

The ion implantation system 100 further comprises a controller 128, wherein the controller is operable to control the ion implantation apparatus 101. For example, the controller 128 is operable to control the power source 108 for producing the ions, as well as the extraction power source 110, wherein the ion beam path P is generally controlled. The controller 128 is further operable to adjust the strength and orientation of the magnetic field associated with the mass analyzer 118, among other things. In another example, the controller 128 is further operable to control the position of the barrier 126 with respect to the ion beam path P, as well as a position of the workpiece 104 within the ion implantation apparatus 101. It will be appreciated that the controller 128 may comprise a processor, computer system, and/or operator for overall control of the system 100 (e.g., a computer system in conjunction with input by an operator).

Figure 3:
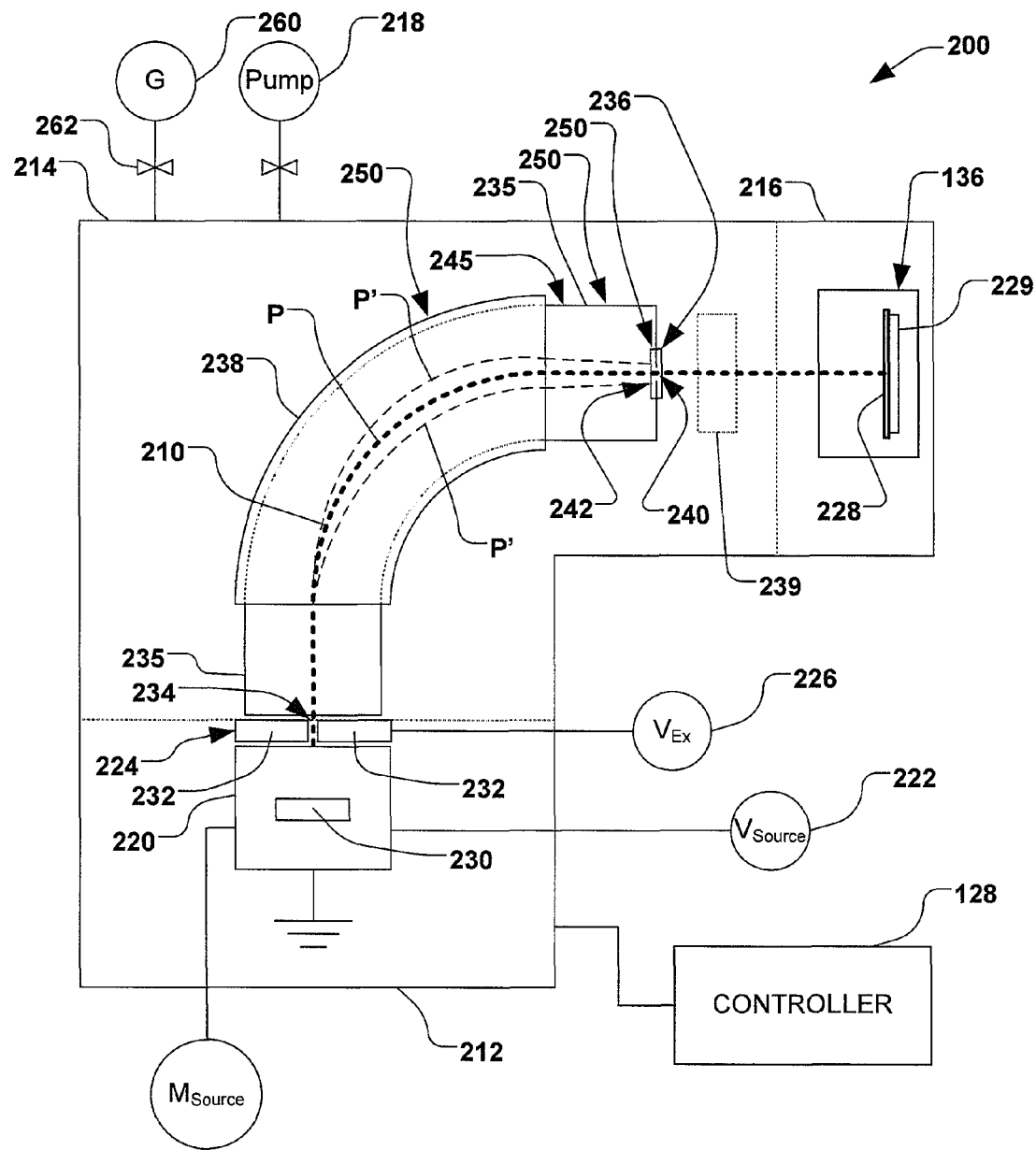
FIG. 3 is a plan view of an exemplary ion implantation apparatus according to another aspect of the present invention.

Referring now to FIG. 3, an exemplary ion implantation apparatus 200 is illustrated, such as the apparatus 101 in FIG. 2, wherein the exemplary ion implantation apparatus is shown in greater detail. It should be again noted that although the ion implantation apparatus 200 is illustrated as one example, the present invention can be practiced using various other types of ion implantation apparatus and systems, such as high energy systems, low energy systems, or other implantation systems, and all such systems are contemplated as falling within the scope of the present invention.

The ion implantation system 200, for example, comprises a terminal 212, a beamline assembly 214, and an end station 216 (e.g., collectively termed a process chamber), wherein the ion implantation system is generally placed under vacuum by one or more vacuum pumps 218. The terminal 212, for example, comprises an ion source 220 powered by a source power supply 222, and an extraction assembly 224 powered by an extraction power supply 226 to extract ions from the ion source 220 and thereby to provide the extracted ion beam 210 to the beamline assembly 214. The extraction assembly 224, in conjunction with the beamline assembly 214, for example, are operable to direct the ions toward a workpiece 228 residing on a support 229 in the end station 216 for implantation thereof at a given energy level.

In one example, the ion source 220 comprises a plasma chamber (not shown) wherein ions of a process material $M_{source}$ are energized at a high positive potential $V_{source}$. It should be noted that generally, positive ions are generated, although the present invention is also applicable to systems wherein negative ions are generated by the source 220. The extraction assembly 224 further comprises a plasma electrode 230 and one or more extraction electrodes 232, wherein the plasma electrode is biased with respect to the one or more extraction electrodes, but floats with respect to the plasma within the ion source 220 (e.g., the plasma electrode at 120 kV with respect to the workpiece 228, wherein the workpiece is typically grounded). The one or more extraction electrodes 232, for example, are biased at a voltage less than that of the plasma electrode 230 (e.g., an extraction voltage $V_{Extract}$ of 0-100 kV). The negative relative potential at the one or more extraction electrodes 232 with respect to the plasma creates an electrostatic field operable to extract and accelerate the positive ions out of the ion source 220. For example, the one or more extraction electrodes 232 have one or more extraction apertures 234 associated therewith, wherein positively charged ions exit the ion source 220 through the one or more extraction apertures to form the ion beam 210, and wherein a velocity of the extracted ions is generally determined by the potential $V_{Extract}$ provided to the one or more extraction electrodes.

The beamline assembly 214, according to one exemplary aspect of the invention, comprises a beamguide 235 having an entrance near the ion source 220 (e.g., associated with the extraction aperture 234) and an exit with a resolving plate 236, as well as a mass analyzer 238 that receives the extracted ion beam 210 and creates a dipole magnetic field to pass only ions of appropriate charge-to-mass ratio or range thereof (e.g., a mass analyzed ion beam having ions of a desired mass range) to the workpiece 228 positioned in the end station 216. The ionization of source materials in the ion source 220 generates a species of positively charged ions having a desired atomic mass. However, in addition to the desired species of ions, the ionization process will also generate a proportion of ions having other atomic masses as well. Ions having an atomic mass above or below the proper atomic mass are not suitable for implantation and are referred to as undesirable species. The magnetic field generated by the mass analyzer 238 generally causes the ions in the ion beam 210 to move in a curved trajectory, and accordingly, the magnetic field is established such that only ions having an atomic mass equal to the atomic mass of the desired ion species traverse the beam path P to the end station 216.

According to another exemplary aspect of the invention, the ion implantation apparatus 200 comprises barrier 239 pivotably coupled thereto, wherein the barrier is operable to be pivoted to selectively intersect the path P of the ion beam 210 in order to measure characteristics of the ion beam and/or substantially prevent the ion beam 210 from entering the end station 216. For example, the barrier comprises a flag Faraday that can be pivoted to intersect the beam path P, wherein the controller 128 of FIG. 2 is operable to determine whether characteristics of the ion beam are satisfactory for ion implantation. After such a determination is made, the controller 128 is operable to translate the flag Faraday out of the beam path P so as to not interfere with ion implantation of ions into the workpiece 124. Alternatively, the barrier 239 of FIG. 3 comprises a Faraday cup (not shown) associated with the end station 216, wherein the ion beam 210 is operable to strike the Faraday cup in the absence of the workpiece 228.

In accordance with still another aspect of the invention, the resolving plate 236 at the exit of the beamguide 235 of FIG. 3 operates in conjunction with the mass analyzer 238 to eliminate undesirable ion species from the ion beam 210 which have an atomic mass close to, but not identical, to the atomic mass of the desired species of ions. The resolving plate 236, for example, is comprised of vitreous graphite or another material such as tungsten or tantalum, and includes one or more elongated apertures 240, wherein the ions in the ion beam 210 pass through the aperture as they exit the beamguide 235. At the resolving plate 236, a dispersion of ions from the path P of the ion beam 210 (e.g., illustrated at P') is at its minimum value, wherein a width of the ion beam (P'-P') is at a minimum where the ion beam 210 passes through the resolving aperture 240.

As explained above, the strength and orientation of the magnetic field of the mass analyzer 238 of FIG. 3, as well as the velocity of the ions extracted from the ion source 220, is established by the controller of FIG. 2, such that generally, only ions having an atomic weight equal to the atomic weight (or charge-to-mass ratio) of the desired species will traverse the predetermined, desired ion beam path P to the end station 216. Undesirable species of ions having an atomic mass much larger or much smaller than the desired ion atomic mass are sharply deflected and impact a housing 245 of the beamguide 235 of FIG. 3.

However, if the atomic mass of an undesirable ion closely approximates the atomic mass of the desired species, the trajectory of the undesirable ion will be only slightly deflected from the desired beam path P. Accordingly, such an undesirable ion having only a slight deflection from the desired beam path P would have a tendency to impact the upstream facing surface 242 of the resolving plate 236. Over time, such undesirable species of ions which impact the resolving plate 236 will tend to build up on the resolving plate.

During operation of the ion implantation apparatus 200, contaminant materials such as undesirable species of ions, sputtered carbon from the resolving aperture 236, beamguide 235, etc., as well as dopant material from the ion source 220, will tend to build up on surfaces 250 of implanter components 252 adjacent the ion beam 210. For example, the upstream facing surface 242 of the resolving plate 236 will have a tendency to build up contaminants (not shown) after repeated ion implantations into workpieces 228. In addition, photoresist material from the workpieces 228 themselves may also build up on the interior surfaces of the ion implantation apparatus 200.

Build up of contaminant materials on the surfaces 250 of components 252 such as the resolving plate 236 has a tendency to eventually flake off during implantation, thus creating disadvantageous electrical discharges and particulate problems. Furthermore, contaminant build up around the resolving aperture 240 (e.g., the upstream facing surface 242 of the resolving plate 236 of FIGS. 4A-4B) further causes desirable ions near the outer extremities of the beam path P' to strike and dislodge the built up contaminants. The dislodged contaminants can further travel to the surface of the workpiece 228, thus potentially causing various undesirable effects on the resulting implanted workpiece.

Transistor features (not shown) are one of the features formed on workpieces 228, wherein, as feature sizes continue to become smaller as technology progresses, the transistors that are produced are formed very near the surface of the workpiece. The formation of Ultra Shallow Junctions (USJ), for example, typically requires ion implantations to be run at energies of a few keV to only a few hundred volts. Ion beam transport at these low energies, however, is limited by space charge effects, therein limiting production, accordingly. Mitigating tools such as ion beam deceleration very near the workpiece 228 have been utilized; however, throughput may suffer, or process results may be compromised due to the use of such tools. Some of these problems can be resolved by the use of molecular implantation. For example, the utilization of large boron hydride molecules (e.g., octadecaborane, $B_{18}H_{22}$) as the process material $M_{source}$ directly enhances the production throughput of ion implanters by delivering multiple boron atoms in a single molecule, wherein the molecule is elevated to a single ion charge state. Designing systems which can handle molecules such as $B_{18}H_{22}$ can present a production advantage. For example, commonly-owned U.S. Pat. No. 6,958,481 describes an ion source system for generating molecular beams, the contents of which are incorporated herein, by reference.

While molecular beams are relatively productive, they can present specific challenges with respect to particulate contamination within the ion implantation system 200, as compared to traditional high-current single-species ion implantation systems. For example, most typical ion implantation systems (also called ion implanters) currently used in the fabrication of semiconductor devices rely on a gaseous species as the ion source process material $M_{source}$, such as hydride gases (e.g., $PH_3$, $AsH_3$, etc.) being provided as the initial dopant material or source gas prior to ionization. Another example of a typical process material $M_{source}$ is gaseous $BF_3$. Alternatively, ion source process materials $M_{source}$, such as those used for implantation of boron hydride chemistries, for example, may be provided in solid form, wherein the solid source material is sublimated in a heated crucible prior to being introduced as a gas into the ion source 220 for ionization. Typical sublimation temperatures are on the order of 90-150 degrees C. The ionization process within the ion source 220, however, is often less than 10% efficient, and the remaining gas becomes an undesirable contaminant as it is pumped through the extraction aperture 234 or arc slit of the ion source 220 (also called an ionization chamber). As the remaining gas cools, residual materials associated therewith deposit on the surfaces 250 of components 252 throughout the ion implantation system 200. Cleaning techniques have been introduced in the prior art to chemically etch the residual materials from the surfaces 250, therein at least partially removing the residual materials from the surfaces and forming a gas that can be pumped out of the system by the vacuum pump 218.

For example, one conventional cleaning method employed when using octadecaborane ($B_{18}H_{22}$) molecules involves the generation of atomic fluorine, and the subsequent introduction of the fluorine into the ion implantation system 200 where the residual material has solidified on surfaces 250 of the associated components 252. The fluorine thus etches the residual material from the surfaces 250, and is subsequently pumped out of the system 200 by the one or more vacuum pumps 218. While such cleaning techniques have been moderately effective in controlling contaminants for the purpose of prolonging the time between preventative maintenance of the ion source 220, they have not been effective in controlling particle contamination that finds its way to the workpiece 228 during processing. Up to now, typical cleaning methods or techniques facilitate the dislodging and/or removal of residual coatings or particle contamination from the surfaces 250 within the system 200 (also called the "vacuum system"). However, the inventors presently appreciate that an important parameter for ion implantation is the number of particles that are actually deposited on the workpiece 228 being implanted, wherein coatings and particles within the vacuum system 200 that do not contaminate the workpiece are not a process issue.

The mechanisms for the deposition of particles on workpieces 228 are varied and can be difficult to analyze. The probability of a particle to be deposited on, or transported to, a workpiece 228, for example, can be a function of various transport mechanisms, such as the presence or absence of any deflecting fields, the quantity, size, and location of the particles, the adhesion quality of the particles or films to a substrate, the presence and proximity to the ion beam 210, the ability of the particle to become charged, and the relationship of the particle and/or workpiece to other mechanical components within the system 200. Previous efforts for control particulate contamination have focused on reducing the quantity of particles in the system through cleaning and removal of the particulate contamination, improving adhesion by design of workpieces or substrates, or control of electromagnetic fields in order to reduce particle transport to the workpiece.

The present invention provides that, in addition to these efforts, it can be advantageous to simply vary the composition of particles through reactive or transformative processes, without depending on the actual removal of the particles. For example, where octadecaborane ($B_{18}H_{22}$) is used a source material $M_{source}$ for molecular implants, solid octadecaborane will eventually decompose or transform to boric acid ($H_3BO_3$) and diborane gas ($B_2H_6$) and/or other compounds in the continuous presence of water.

Thus, in accordance with the present invention, a gas, such as water vapor or air containing water vapor (e.g., a predetermined amount of water vapor or known humidity), is introduced to the ion implantation system 200 via a gas source 260 though one or more valves 262, where at least a portion of the contaminants or particles deposited on the surfaces 250 are transformed from a first state (e.g., mainly solid boron hydrides such as octadecaborane or decaborane) to a second state (e.g., boric acid and diborane gas). This transformation is also referred to by the inventors as stabilization or passivation of the contaminants. It should be noted that the gas source 260 and one or more vacuum pumps 218 can be in selective fluid communication with one or more of the terminal 212, beamline assembly 214, and end station 216.

The gas that is introduced to the ion implantation system 200, for example, preferably comprises a non-etchant gas, as compared to an etchant gas such as fluorine. The diborane gas that is produced, for example, can be pumped from the ion implantation system or vacuum chamber 200 by the one or more vacuum pumps 218, while the boric acid can be left to remain in place within the ion implantation system. Alternatively, the diborane gas (or other products of the transformation) can be left in the ion implantation system 200 without being specifically pumped from the system. As such, the present invention appreciates that the at least a portion (e.g., boric acid) of the second state of the one or more contaminants remaining on the surfaces 250 (or within the system) generally does not produce particle contamination on the one or more workpieces. For example, mechanical properties, such as size or adhesion characteristics, of the at least a portion of the second state of the one or more contaminants may permit the at least a portion of the second state of the one or more contaminants to remain within the ion implantation system 200 without detrimental effects to subsequent ion implantations.

Thus, the present invention appreciates that the decomposition products of a boron hydride after the introduction of water vapor, for example, can be advantageous for particle control, in that the decomposition products can have different characteristics with respect to one or more of the transport mechanisms described above. In order to initiate the transformative processes, the gas can be introduced to the vacuum chambers of the ion implantation system 200 either continuously, or can be based on the activity of the system, such as during preventative maintenance or idle time, wherein a control of the one or more valves 262 and/or the gas source 260 can be further controlled via the controller 128.

In the example of the gas being introduced continuously, the flow rate can be provided sufficiently low enough to not have other process impacts, such as a dose shift. It should be noted that, in one example, the majority (e.g., greater than 50%) of the contaminants remain within the ion implantation system, however the contaminants may be in an altered state. It should also be noted that the gas source 260 may comprise other gases containing water, and all such gases are contemplated as falling within the scope of the invention. It should also be noted that the stabilization or passivation of the residual boron hydride contaminants in the ion implantation system 200 via the introduction of the gas is applicable to the multiple forms of boron hydrides. Examples of other boron hydrides include, but is not limited to, $B_{10}H_{14}$, $B_{18}H_{22}$, $B_{20}H_{24}$, as well as carboranes such as $C_2B_{10}H_{12}$. Thus, in general, the invention is applicable to ion implantation systems using $B_nH_{x+}$, and $B_nH_{x-}$ where $10<n<100$ and $0<=x<=n+4$, and for systems using molecules with three elements $Q_nB_nH_x$, where Q is the additional element. An example of such an elements is $C_2B_{10}H_{12}$.

Figure 4:
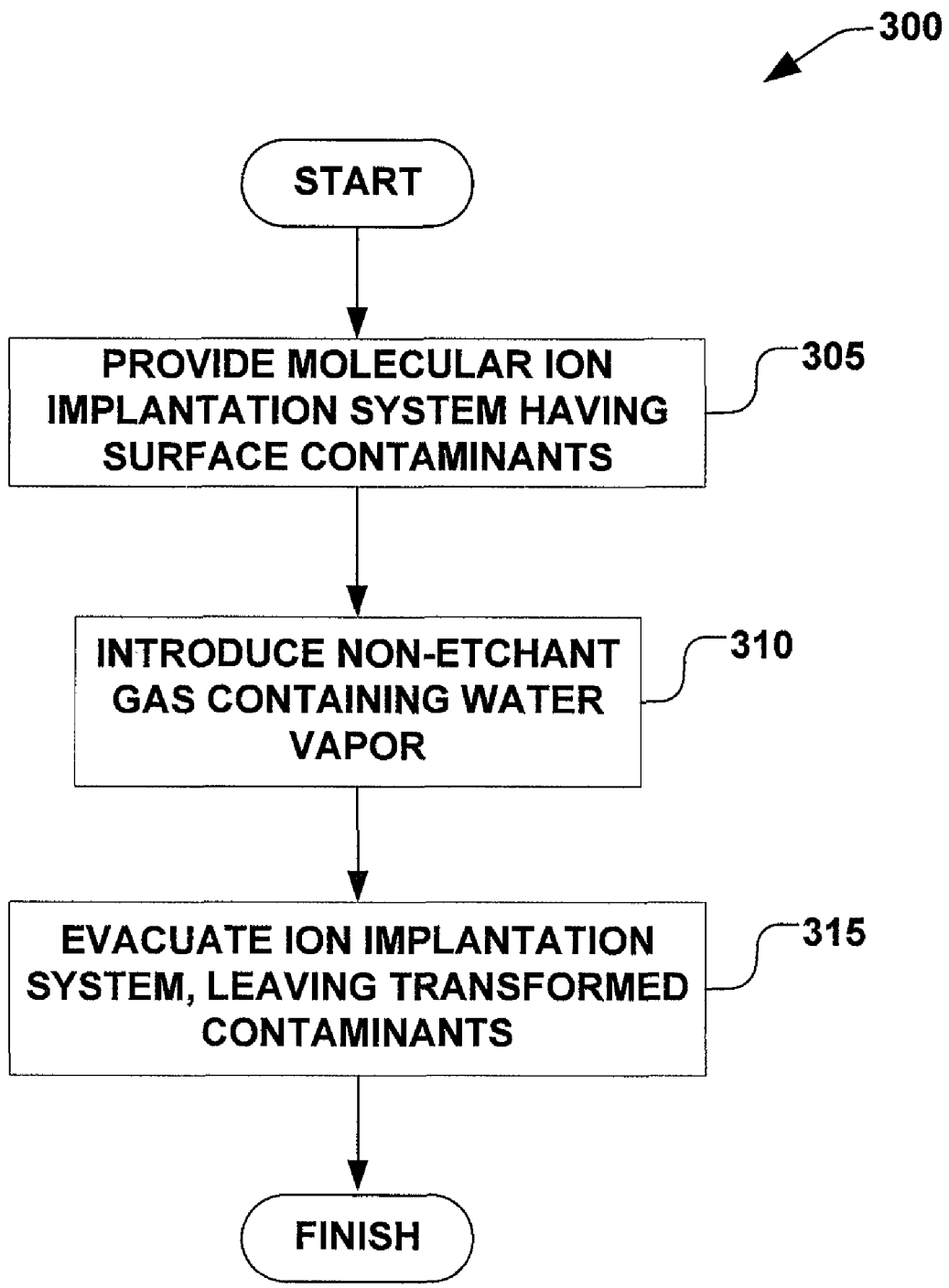
FIG. 4 is a block diagram of an exemplary method for reducing particle contamination during an implantation of ions into one or more workpieces according to another exemplary aspect of the invention.

Thus, in accordance with another aspect of the present invention, FIG. 4 illustrates a method 300 for reducing particle contamination in an ion implantation system, such as those caused by molecular boron hydride (e.g., octadecaborane) ion implantations. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 4, the method 300 begins with providing an ion implantation system in act 305, wherein the ion implantation system is configured to implant ions into the one or more workpieces via an ion beam, such as the ion implantation system 100 or 200 of FIGS. 2 and 3. In one particular example, the ion implantation system is configured to implant various forms of boron hydrides into the one or more workpieces. The ion implantation system comprises one or more components under selective vacuum, wherein the one or more components have one or more contaminants associated with a formation of the ion beam disposed thereon. Initially, the one or more contaminants are generally in a first state.

In act 310, a gas is introduced or vented into the ion implantation system, wherein the gas generally reacts with at least a portion of the one or more contaminants. The gas, for example, comprises a non-etchant gas consisting of, or alternatively comprising, water vapor. Accordingly, the gas generally transforms the at least a portion of the one or more contaminants into a second state. The second state, for example, can comprise one or more of boric acid and diborane gas.

In act 315, the ion implantation system is generally evacuated, wherein the at least a portion of the one or more contaminants in the second state remain disposed on the one or more components, and wherein the at least a portion of the second state of the one or more contaminants preferentially do not produce particle contamination on the one or more workpieces. For example, boric acid may be left to remain on the one or more components, while the diborane gas is removed via one or more vacuum pumps.

It is noted that the introduction of the gas of act 310 can be performed continuously (e.g., concurrent with the evacuation of act 315), or in series. If performed continuously, for example, the flow of the gas can be further controlled so as to not significantly impact processing of the one or more workpieces.

It should also be noted that the boron hydride molecule (e.g., a $B_{18}H_{22}$ octadecaborane molecule) can be implanted using any ion implantation device suitable for handling boron hydride or borane clusters such as those disclosed in U.S. Pat. Nos. 6,013,332; 6,107,634; 6,288,403; 6,958,481; 6,452,338; 7,185,602; and 6,013,332. The ion beam produced by the particular ion implantation device may be configured as a spot beam mechanical scan, wherein the workpiece is mechanically scanned in two dimensions orthogonal to a generally stationary spot beam having an approximately circular cross-section of a particular diameter depending on the characteristics of the spot beam; a ribbon beam, wherein the beam is fixed in one direction across the workpiece while the workpiece is mechanically scanned in an orthogonal direction, and wherein the ribbon beam may have a large width/height aspect ratio and may be at least as wide as the workpiece; or an electromagnetically or electrostatically scanned beam that is scanned in one direction across a workpiece that is mechanically scanned in an orthogonal direction. An exemplary ion implantation device is the OPTIMA HD™ ion implantation device commercially available from Axcelis Technologies, Inc, which is configured to provide a spot beam 2-dimensional mechanical scan.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:
1. An ion implantation system, comprising:
an ion source operable to ionize at least boron hydride chemistries;
a beamline assembly for transporting a beam of ions generated by the ion source;
a process chamber housing a workpiece for receiving the beam of ions for implantation thereof;
a vacuum source in selective fluid communication with the process chamber;

a gas source in selective fluid communication with the process chamber, wherein the gas source provides a gas containing at least water vapor; and a controller, wherein the controller is configured to selectively vent the gas from the gas source to the process chamber and to selectively evacuate the process chamber via control of the respective gas source and vacuum source, wherein boron hydride contamination is generally mitigated by an interaction between the gas and boron hydride.

2. The ion implantation system of claim 1, further comprising one or more valves disposed between the process chamber and the gas source, wherein the controller is further configured to control a flow of the gas to the process chamber via control of the one or more valves.

3. The ion implantation system of claim 1, wherein the boron hydride chemistry comprises decaborane or octadecaborane.

4. A method for reducing particle contamination during an implantation of ions into one or more workpieces, the method comprising:

providing an ion implantation system for implanting ions into the one or more workpieces via a boron hydride ion beam, wherein the ion implantation system comprises one or more components under selective vacuum, wherein the one or more components have one or more boron hydride contaminants associated with a formation of the boron hydride ion beam disposed thereon;

introducing a gas to the ion implantation system, wherein the gas contains water vapor, and wherein the gas generally reacts with at least a portion of the one or more boron hydride contaminants, therein generally transforming the at least a portion of the one or more boron hydride contaminants into boric acid and diborane gas, wherein one or more of the boric acid and diborane gas are generally maintained within the ion implantation during subsequent implantation of ions into the one or more workpieces.

5. The method of claim 3, further comprising implanting boron hydride ions into the one or more workpieces, wherein the gas is introduced concurrently with the implantation.

6. The method of claim 3, wherein the gas comprises air having a predetermined amount of water vapor.

7. The method of claim 3, wherein the boron hydride ion beam comprises a molecular decaborane or octadecaborane ion beam.

8. The method of claim 3, further comprising generally evacuating the diborane gas from the ion implantation system, wherein the boric acid remains generally disposed on the one or more components.

* * * * *